US010615056B2

(12) United States Patent
Chew

(10) Patent No.: US 10,615,056 B2
(45) Date of Patent: Apr. 7, 2020

(54) METHOD OF PACKAGING CHIP AND CHIP PACKAGE STRUCTURE

(71) Applicant: PEP INNOVATION PTE LTD., Singapore (SG)

(72) Inventor: Hwee Seng Jimmy Chew, Singapore (SG)

(73) Assignee: PEP INNOVATION PTE LTD., Singapore (SG)

( * ) Notice: Subject to any disclaimer, the term of this patent is extended or adjusted under 35 U.S.C. 154(b) by 0 days.

(21) Appl. No.: 15/826,257

(22) Filed: Nov. 29, 2017

(65) Prior Publication Data

US 2018/0204741 A1    Jul. 19, 2018

(30) Foreign Application Priority Data

Nov. 29, 2016  (SG) ............................ 10201610033Y
Mar. 8, 2017   (SG) ........................... 10201701865W

(51) Int. Cl.
    *H01L 23/48*    (2006.01)
    *H01L 23/52*    (2006.01)
    (Continued)

(52) U.S. Cl.
    CPC ........ *H01L 21/561* (2013.01); *H01L 23/3135* (2013.01); *H01L 24/02* (2013.01);
    (Continued)

(58) Field of Classification Search
    None
    See application file for complete search history.

(56) References Cited

U.S. PATENT DOCUMENTS

| 6,396,159 B1 * | 5/2002 | Shoji ...................... H01L 23/16 257/668 |
| 2011/0026232 A1 * | 2/2011 | Lin ................... H01L 21/76898 361/760 |

(Continued)

OTHER PUBLICATIONS

Co-pending U.S. Appl. No. 15/826,261, entitled, "Method of Packaging Chip and Chip Package Structure," filed Nov. 29, 2017.
Co-pending U.S. Appl. No. 15/826,268, entitled, "Method of Packaging Chip and Chip Package Structure," filed Nov. 29, 2017.

*Primary Examiner* — Calvin Y Choi
(74) *Attorney, Agent, or Firm* — Nixon Peabody LLP; Thomas P. Pavelko

(57) ABSTRACT

The present disclosure discloses a method of packaging a chip and a chip package structure. The method of packaging the chip includes: mounting at least one chip to be packaged on a carrier, a back surface of the chip to be packaged facing upwards and an active surface facing towards the carrier; forming a sealing layer, the sealing layer being at least wrapped around the at least one chip to be packaged; forming a first encapsulation layer, wherein the first encapsulation layer covers the entire carrier for encapsulating the at least one chip to be packaged and the sealing layer; detaching the carrier to expose the active surface of the at least one chip to be packaged; and completing the packaging by a rewiring process on the active surface of the at least one chip to be packaged. The active surface of the chip to be packaged is mounted on the carrier, and the chip to be packaged is fixed on the carrier at a predetermined position by the sealing layer, so that the position of the chip to be packaged in the subsequent process is not easily moved.

19 Claims, 11 Drawing Sheets

(51) Int. Cl.
  H01L 29/40 (2006.01)
  H01L 21/56 (2006.01)
  H01L 23/31 (2006.01)
  H01L 23/00 (2006.01)

(52) U.S. Cl.
  CPC .............. *H01L 24/18* (2013.01); *H01L 24/19* (2013.01); *H01L 24/24* (2013.01); *H01L 24/25* (2013.01); *H01L 24/82* (2013.01); *H01L 24/96* (2013.01); *H01L 24/97* (2013.01); *H01L 21/568* (2013.01); *H01L 23/3121* (2013.01); *H01L 2224/02311* (2013.01); *H01L 2224/02331* (2013.01); *H01L 2224/02379* (2013.01); *H01L 2224/02381* (2013.01); *H01L 2224/24195* (2013.01); *H01L 2224/25171* (2013.01); *H01L 2224/821* (2013.01); *H01L 2224/92144* (2013.01); *H01L 2224/95001* (2013.01); *H01L 2924/15192* (2013.01); *H01L 2924/19105* (2013.01); *H01L 2924/3511* (2013.01)

(56) References Cited

U.S. PATENT DOCUMENTS

| | | | |
|---|---|---|---|
| 2011/0278741 A1* | 11/2011 | Chua | H01L 21/561 257/777 |
| 2015/0314941 A1* | 11/2015 | Ramadas | B32B 5/16 361/679.01 |
| 2016/0155713 A1* | 6/2016 | Kim | H01L 23/645 257/659 |
| 2016/0338202 A1* | 11/2016 | Park | H01L 23/48 |

\* cited by examiner

METHOD OF PACKAGING CHIP AND CHIP PACKAGE STRUCTURE

TECHNICAL FIELD

The present disclosure relates to the field of semiconductor technology, and in particular, to a method of packaging a chip and to a chip package structure.

BACKGROUND

In the prior art, a common chip packaging technology mainly includes the following processes. First, the active surface of the chip is adhered to the substrate wafer by an adhesive tape and plastic-packaged on wafer level, and the substrate wafer is detached. Then, a rewiring layer is formed by performing rewiring on the active surface of the chip, and solder balls are planted. Finally, the package body is cut into single pieces. In this packaging technology, an adhesive tape is used for the adhering, and the adhesive force thereof is difficult to be ensured under the high temperature in the plastic packaging. As a result, the chip will be displaced under the impact of the plastic packaging material mold flow during the plastic packaging, and thus the subsequent rewiring process is affected. Therefore, the packaging process is difficult to control and the yield is not high. In addition, the chip is directly embedded in the plastic package body. Due to the different thermal expansion coefficients of the chip and the plastic package body, stress will be certainly caused by the temperature changes and thus the wafer is prone to warp greatly, thereby affecting the reliability of the package product. On the other hand, during use, due to the presence of the stress, the chip is also likely to be displaced or fall off, thereby affecting the reliability of the package product in use.

SUMMARY

According to the first aspect, the embodiment of the present disclosure provides a method of packaging a chip, including:

mounting at least one chip to be packaged on a carrier, a back surface of the chip to be packaged facing upwards and an active surface facing towards the carrier;

forming a sealing layer, the sealing layer being at least wrapped around the at least one chip to be packaged;

forming a first encapsulation layer, wherein the first encapsulation layer covers the entire carrier for encapsulating the at least one chip to be packaged and the sealing layer;

detaching the carrier to expose the active surface of the at least one chip to be packaged; and completing the packaging by a rewiring process on the active surface of the at least one chip to be packaged.

Optionally, the step of mounting the at least one chip to be packaged on the carrier includes:

forming an adhesive layer on the carrier; and mounting the at least one chip to be packaged on the carrier at a predetermined position by the adhesive layer.

Optionally, the step of forming the sealing layer includes:

covering a sealing material on the back surface mounted with the at least one chip to be packaged and an exposed surface of the adhesive layer by using a semiconductor process;

removing the sealing material on the back surface of the at least one chip to be packaged; and curing the sealing material.

Optionally, the height of the sealing layer is lower than the height of the at least one chip to be packaged, and the sealing layer is a thermosetting insulating material or an ultraviolet curing insulating material.

Optionally, the step of completing the packaging by the rewiring process on the active surface of the at least one chip to be packaged includes:

forming a passivation layer on the active surface of the at least one chip to be packaged and the sealing layer;

forming a first opening in the passivation layer at a position corresponding to a bonding pad of the at least one chip to be packaged;

forming a first rewiring layer such that the first rewiring layer is electrically connected to the bonding pad of the at least one chip to be packaged through the first opening; and forming a second encapsulation layer for encapsulating the first rewiring layer and the exposed passivation layer and leading out a bonding pad or a connection point of the first rewiring layer through a first electrically conductive stud.

Optionally, the step of completing the packaging by the rewiring process on the active surface of the at least one chip to be packaged further includes:

forming a second rewiring layer on the second encapsulation layer, the second rewiring layer being electrically connected to the bonding pad or the connection point of the first rewiring layer through the first electrically conductive stud; and forming a third encapsulation layer for encapsulating the second rewiring layer and the exposed second encapsulation layer and leading out a bonding pad or a connection point of the second rewiring layer through a second electrically conductive stud.

Optionally, the step of forming the second encapsulation layer for encapsulating the first rewiring layer and the exposed passivation layer and leading out the bonding pad or the connection point of the first rewiring layer through the first electrically conductive stud includes:

forming the first electrically conductive stud on the bonding pad or the connection point of the first rewiring layer; and forming the second encapsulation layer on the first rewiring layer and the exposed passivation layer and exposing the first electrically conductive stud; or the step of forming the second encapsulation layer for encapsulating the first rewiring layer and the exposed passivation layer and leading out the bonding pad or the connection point of the first rewiring layer through the first electrically conductive stud includes:

forming the second encapsulation layer on the first rewiring layer and the exposed passivation layer;

forming a second opening on the second encapsulation layer at a position corresponding to the bonding pad or the connection point of the first rewiring layer; and forming the first electrically conductive stud in the second opening.

Optionally, the step of forming the third encapsulation layer for encapsulating the second rewiring layer and the exposed second encapsulation layer and leading out the bonding pad or the connection point of the second rewiring layer through the second electrically conductive stud includes:

forming the second electrically conductive stud on the bonding pad or the connection point of the second rewiring layer; and forming the third encapsulation layer on the second rewiring layer and the exposed second encapsulation layer and exposing the second electrically conductive stud; or the step of forming the third encapsulation layer for encapsulating the second rewiring layer and the exposed second encapsulation layer and leading out the bonding pad or the connection point of the second rewiring layer through the second electrically conductive stud includes:

forming the third encapsulation layer on the second rewiring layer and the exposed second encapsulation layer;

forming a third opening on the third encapsulation layer at a position corresponding to the bonding pad or the connection point of the second rewiring layer; and forming the second electrically conductive stud in the third opening.

Optionally, the method further includes:

mounting at least one passive component on the carrier at a position in the vicinity of the at least one chip to be packaged prior to forming the sealing layer, a back surface of the passive component facing upwards, and an active surface facing towards the first carrier; and performing rewiring on the active surface of the at least one passive component while completing the packaging by the rewiring process on the active surface of the at least one chip to be packaged.

Optionally, when forming the sealing layer, the sealing layer is also wrapped around the at least one passive component so as to fix the position of the at least one passive component unchanged.

Optionally, the method further includes at least one of:

when a thickness of the at least one passive component is identical to a thickness of the at least one chip to be packaged, removing the back surface of the at least one passive component and the sealing layer on the back surface of the at least one chip to be packaged prior to forming the first encapsulation layer;

when the thickness of the at least one passive component is smaller than the thickness of the at least one chip to be packaged, removing the sealing layer on the back surface of the at least one chip to be packaged prior to forming the first encapsulation layer; and when the thickness of the at least one passive component is greater than the thickness of the at least one chip to be packaged, removing the sealing layer on the back surface of the at least one passive component prior to forming the first encapsulation layer.

According to the second aspect, the embodiment of the present disclosure provides a chip package structure, including:

a first encapsulation layer disposed with at least one concave first cavity;

at least one chip to be packaged located in the first cavity, a back surface of the at least one chip to be packaged facing towards the first encapsulation layer;

a sealing layer formed on an upper surface of the first encapsulation layer and at least wrapped around the at least one chip to be packaged; and a rewiring structure formed on an active surface of the at least one chip to be packaged for leading out a bonding pad on the active surface of the at least one chip to be packaged.

Optionally, the rewiring structure includes:

a passivation layer formed on the sealing layer and the active surface of the at least one chip to be packaged and provided with a first opening at a position corresponding to a position of the bonding pad on the at least one chip to be packaged;

a first rewiring layer formed on the passivation layer and electrically connected to the bonding pad of the at least one chip to be packaged through the first opening; and a second encapsulation layer formed on the first rewiring layer and having a second opening, wherein a first electrically conductive stud electrically connected to the first rewiring layer is disposed in the second opening.

Optionally, the chip package structure further includes:

at least one passive component located in at least one concave second cavity disposed on the first encapsulation layer, wherein the second cavity is disposed in the vicinity of the first cavity, a back surface of the at least one passive component faces towards the first encapsulation layer, and the sealing layer is further wrapped around the at least one passive component.

Optionally, one of the back surface of the at least one chip to be packaged and the back surface of the at least one passive component is in direct contact with the first encapsulation layer, and the other one and the first encapsulation layer are provided with the sealing layer therebetween; or both the back surface of the at least one chip to be packaged and the back surface of the at least one passive component are in direct contact with the first encapsulation layer.

Optionally, the at least one passive component is a connecting component array including a plurality of electrically conductive studs, and the connecting component array is integrally packaged by an insulating material.

Optionally, the chip package structure further includes:

a second rewiring layer formed on the second encapsulation layer and electrically connected to a bonding pad or a connection point of the first rewiring layer through the first electrically conductive stud; and a third encapsulation layer for encapsulating the second rewiring layer and the exposed second encapsulation layer and leading out the bonding pad or a connection point of the second rewiring layer through the second electrically conductive stud.

Optionally, a plurality of the chips to be packaged and a plurality of the first cavities are included, and each of the chips to be packaged is respectively located in one of the first cavities.

Optionally, the sealing layer is continuously and uninterruptedly formed on the upper surface of the first encapsulation layer and is at least wrapped around the chip to be packaged.

DETAILED DESCRIPTION

Figure 1:
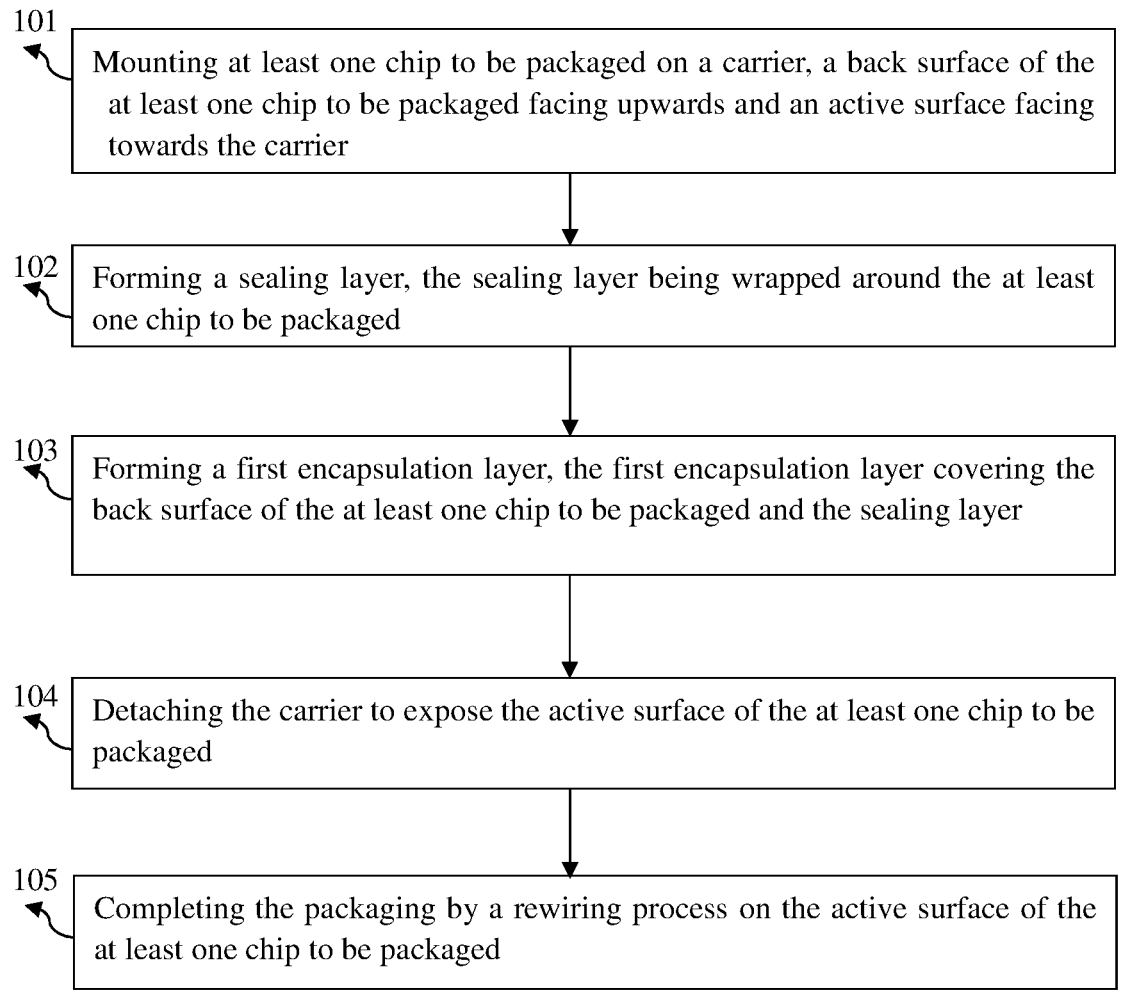
FIG. 1 is a flowchart of a method of packaging a chip according to an exemplary embodiment of the present disclosure.

To make the objectives, technical solutions, and advantages of the present disclosure more comprehensible, the present disclosure is further described in detail below with reference to the specific embodiments and the accompanying drawings.

However, those skilled in the art will readily appreciate that the detailed description given herein with respect to these drawings is for explanatory purposes as the disclosure extends beyond these limited embodiments. For example, it should be appreciated that those skilled in the art will, in light of the teachings of the present disclosure, recognize a multiplicity of alternate and suitable approaches, depending upon the needs of the particular application, to implement the functionality of any given detail described herein, beyond the particular implementation choices in the following embodiments described and shown. That is, there are modifications and variations of the disclosure that are too numerous to be listed but that all fit within the scope of the disclosure. Also, singular words should be read as plural and vice versa and masculine as feminine and vice versa, where appropriate, and alternative embodiments do not necessarily imply that the two are mutually exclusive.

It is to be further understood that the present disclosure is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present disclosure. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

As used in this specification and claim(s), the words 'comprising' (and any form of comprising, such as 'comprise' and 'comprises'), 'having' (and any form of having, such as 'have' and 'has'), 'including' (and any form of including, such as 'includes' and 'include'), or 'containing' (and any form of containing, such as 'contains' and 'contain') are inclusive or open-ended and do not exclude additional, unrecited elements or method steps.

During packaging, if the chip to be packaged is displaced, it may not be able to predict the position of the chip to be packaged after the displacement in the subsequent rewiring, that is, the rewiring layer may not be accurately electrically connected to the bonding pad on the chip to be packaged. This problem is particularly acute when performing fan-out packaging by using a large-sized carrier. Therefore, in some existing packaging methods, the wiring size of the rewiring layer is increased so that the rewiring layer can still contact the bonding pad of the chip to be packaged when the chip to be packaged is displaced. However, in this way, the wiring size of the rewiring layer is relatively large and the larger the size of the carrier is, the larger the displacement of the chip to be packaged is, the more difficult it is to predict the displacement of the chip to be packaged. As a result, the difficulty of expanding the size of the carrier is increased, and the amount of chips packaged at one time is limited.

According to various embodiments of the present disclosure, there is provided a method of packaging a chip. During packaging, a chip to be packaged is mounted on a carrier, the active surface of the chip to be packaged facing towards the carrier and the back surface facing upwards, i.e., facing outwards with respect to the carrier. Then, a sealing layer is formed. The sealing layer is at least wrapped around the chip to be packaged so as to fix the position of the chip to be packaged. And a first encapsulation layer is formed. The first encapsulation layer covers the carrier to encapsulate the sealing layer and the chip to be packaged. After the encapsulation is completed, the carrier is detached, i.e., the carrier is removed to expose the active surface of the chip to be packaged and the sealing layer formed around the chip to be packaged. After that, a rewiring process may be performed on the active surface of the chip to be packaged. In the above embodiment of the present disclosure, the active surface of the chip to be packaged is mounted on the carrier and the chip to be packaged is fixed at a predetermined position of the carrier by using the sealing layer, so that the position of the chip to be packaged is not easily moved in a subsequent process, which helps to expand the carrier size and reduce the difficulty of chip packaging, thus saving the packaging cost.

Figure 2:
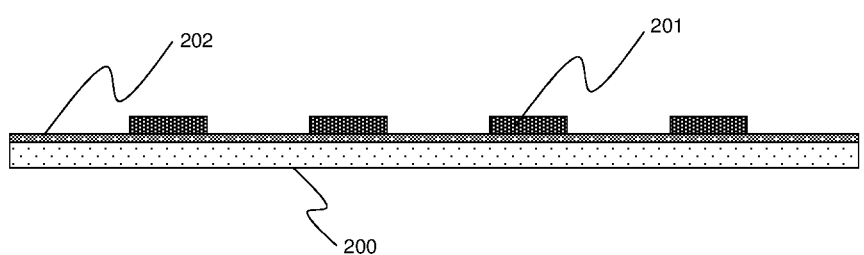
FIGS. 2(a) to 2(l) illustrate a method of packaging a chip in an exemplary embodiment of the present disclosure.
Figure 2:
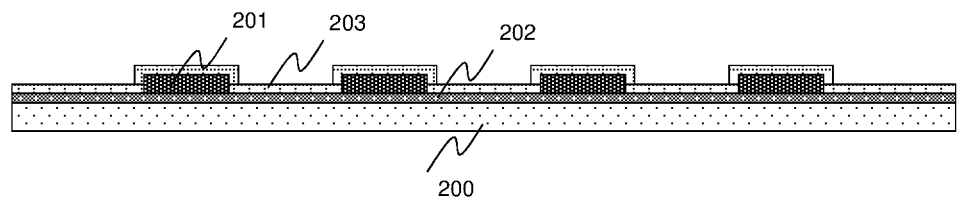
Figure 2:
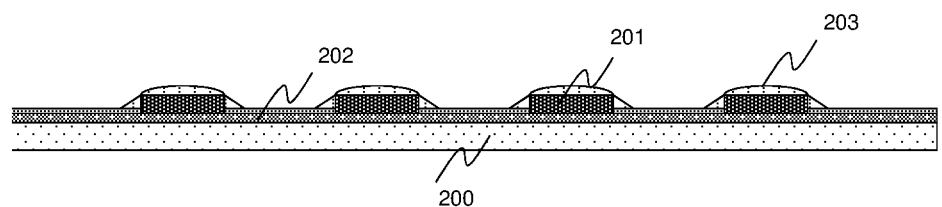
Figure 2:
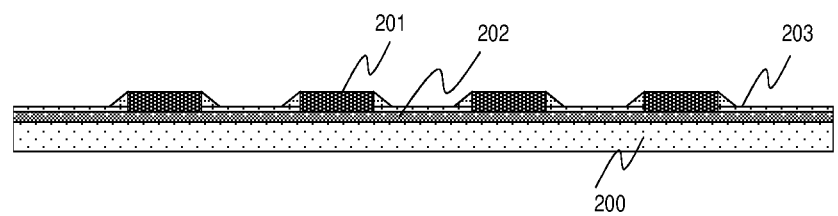
Figure 2:
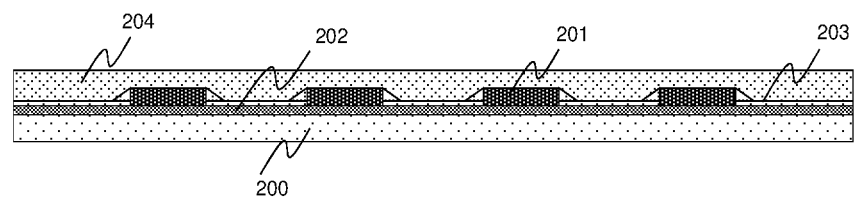
Figure 2:
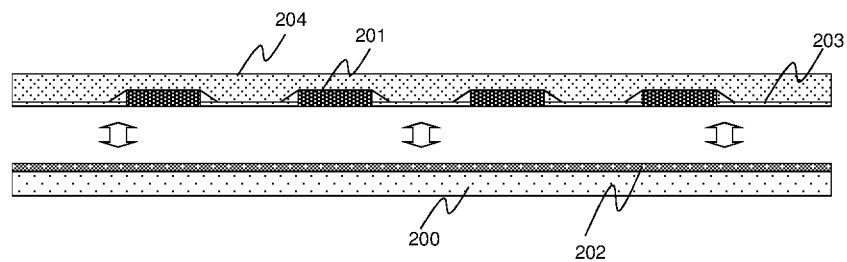
Figure 2:
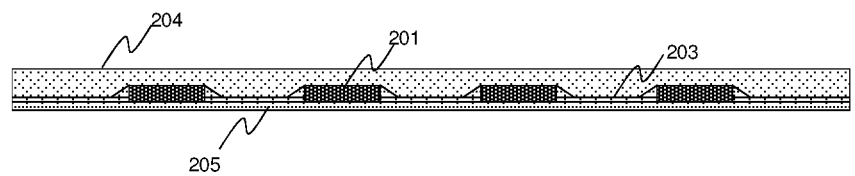
Figure 2:
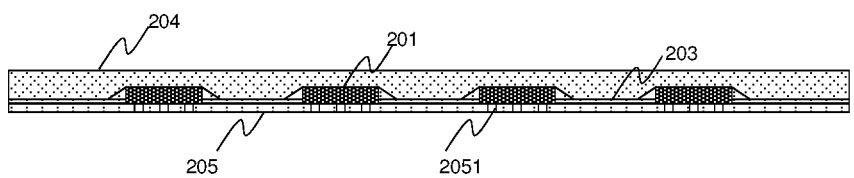
Figure 2:
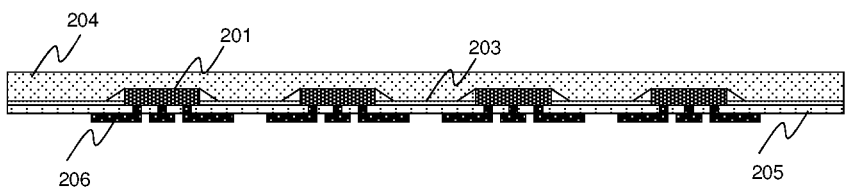
Figure 2:
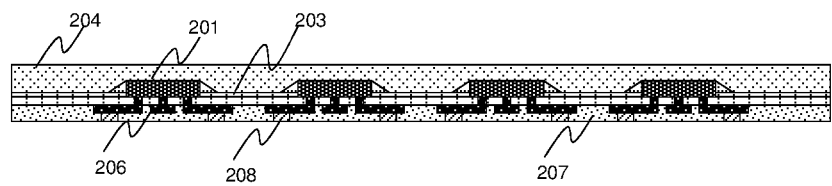
Figure 2:
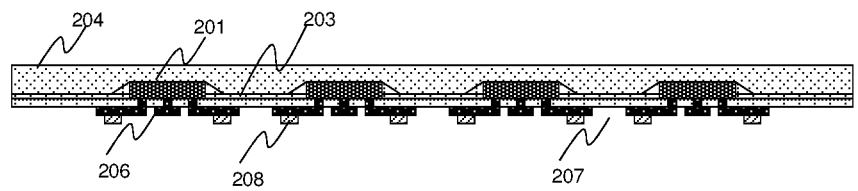
Figure 2:
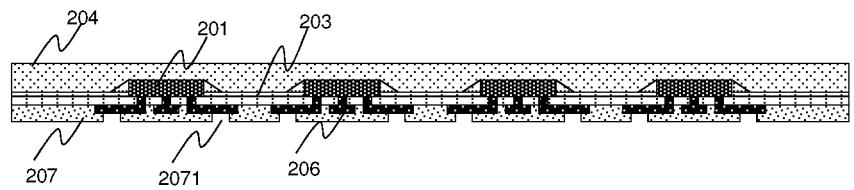
Figure 2:
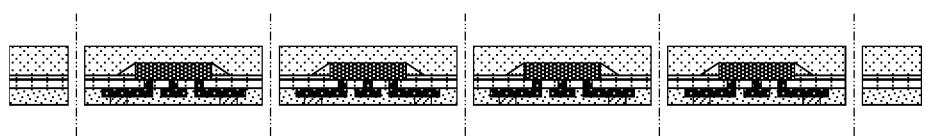

FIG. 1 is a flowchart of a method of packaging a chip according to an exemplary embodiment of the present disclosure. As shown in FIG. 1, the method of packaging the chip includes the following steps 101 to 105. Wherein, in step 101, at least one chip to be packaged is mounted on a carrier, a back surface of the chip to be packaged facing upwards and an active surface facing towards the carrier;

FIGS. 2(*a*) to (*l*) show the process flowcharts of a method of packaging a chip in an exemplary embodiment of the present disclosure.

As shown in FIG. 2(*a*), a chip 201 to be packaged (a plurality of chips to be packaged are shown in the figure) are mounted on a carrier 200. The chip 201 to be packaged and the carrier 200 are connected by an adhesive layer 202.

In one embodiment, the chip 201 to be packaged is formed by thinning and cutting a semiconductor wafer. The active surface of the chip 201 to be packaged is configured by conductive electrodes that are led out from an internal circuit of the chip to the surface of the chip. Pads or connection points are prepared on these conductive electrodes.

In one embodiment, the shape of the carrier 200 may include a circular shape, a rectangular shape or other shapes. The present disclosure does not limit the shape of the carrier 200. The carrier 200 may be a small-sized wafer substrate, or may be a larger-sized carrier such as a stainless steel plate, a polymer substrate, or the like. With the method of packaging the chip according to the embodiment of the present disclosure, the size of a carrier that can be adopted can reach 600*600 mm. In the conventional method of packaging the chip, when the encapsulation layer is formed, the encapsulation material needs to be cured and the curing may cause the shrinkage of the encapsulation material, thereby causing the chip to deviate from the original mounting position, which makes it difficult to grasp the actual position of the chip during the subsequent rewiring. The larger the area of the carrier is, the greater the deviation of the chip from the center of the carrier is and the greater the difficulty of the rewiring is. On the other hand, in the embodiment of the present disclosure, the chip is locked at the mounting position by the sealing layer, so that the deviation of the chip is avoided or reduced when the material is shrunk during the formation of the encapsulation layer, and the difficulty of packaging is reduced. At the same time, a carrier with larger area than that in the prior art can be selected, so that more chips can be packaged at a time, and the packaging cost can be further reduced.

In one embodiment, the chip 201 to be packaged may be mounted on the carrier 200 by an adhesive layer 202. An easily peelable material may be used for the adhesive layer 202 so as to detach the carrier 200 from the chip 201 to be packaged having been packaged on the back surface. For example, a thermal separation material capable of losing its viscosity by heating may be used. In other embodiments, the adhesive layer 202 may adopt a two-layer structure including a layer of thermal separation material and a chip attachment layer. The layer of thermal separation material is adhered to the carrier 200 and will lose its viscosity when heated, and can be detached from the carrier 200. The chip attachment layer is used for adhering the chip 201 to be packaged. After the chip 201 to be packaged is detached from the carrier 200, the chip attachment layer may be removed by chemical cleaning. In one embodiment, the adhesive layer 202 may be formed on the carrier 200 by lamination, printing, or the like.

Figure 3:
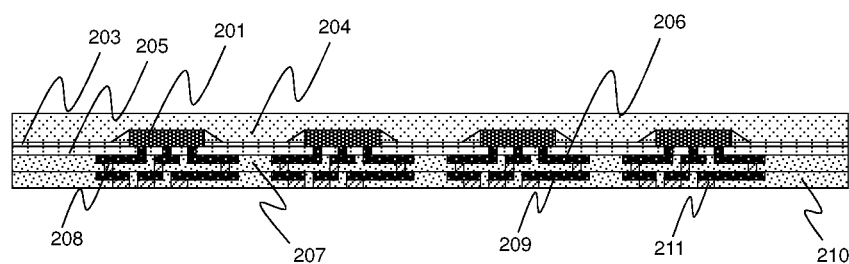
FIG. 3 is a schematic structural diagram of the active surface of a carrier according to an exemplary embodiment of the present disclosure.
Figure 3:
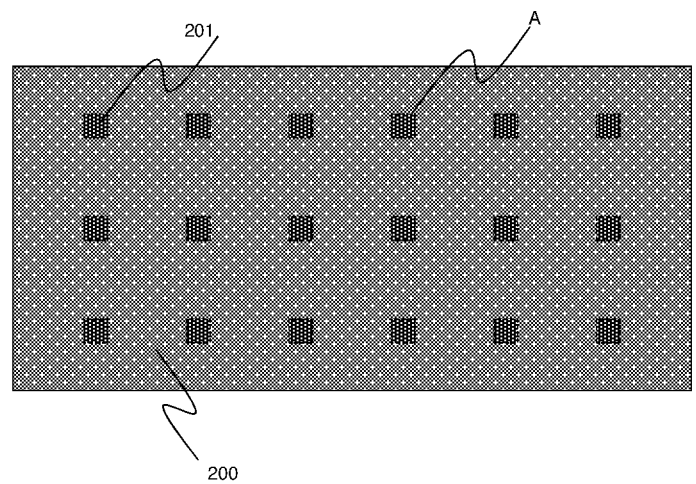

In one embodiment, as shown in FIG. 3, an adhering position of the chip 201 to be packaged is provided in advance on the carrier 200. After the adhesive layer 202 is formed, the chip 201 to be packaged is adhered on the carrier 200 at a predetermined position A. In one embodiment, prior to the formation of the adhesive layer 202, all of the adhering positions of the chips to be packaged may be marked on the carrier 200 by laser, mechanical engraving, photolithography or the like. At the same time, alignment marks are also provided on the chip 201 to be packaged so as to be aligned with the adhering positions on the carrier 200 at the time of adhering. It can be understood that, in one packaging process, there may be a plurality of chips 201 to be packaged, that is, a plurality of chips 201 to be packaged are simultaneously mounted on the carrier 200 for packaging, and then cut into a plurality of package bodies after the packaging is completed. One package body may include one or more chips, and the positions of the plurality of chips may be set according to the actual product requirements.

In step 102, a sealing layer is formed, the sealing layer being at least wrapped around the at least one chip to be packaged.

As shown in FIG. 2(b1) to FIG. 2(b2), the sealing layer 203 is formed on the back surface of the chip to be packaged and the exposed adhesive layer 202 so as to wrap up the chip 201 to be packaged. In one embodiment, the sealing layer 203 may adopt polymer insulating material liquid or paste and may be formed by spraying, printing, coating, etc. The thickness of the sealing layer 203 is smaller than the thickness of the chip 201 to be packaged. The difference between the two forms of FIG. 2(b1) and FIG. 2(b2) mainly depends on the difference of material of the sealing layer 203 and the difference of forming process. According to the actual material and process, one of the forms may be formed.

Optionally, in one embodiment, the sealing layer 203 formed on the back surface of the chip 201 to be packaged may be removed, and that the sealing layer 203 on the back surface of the chip 201 to be packaged has been removed is as shown in FIG. 2(b3). For example, a material such as a board, a tape or the like may be used to stick away the excess sealing layer material on the back surface of the chip 201 to be packaged, so that when the first encapsulation layer is subsequently formed, the thickness of the first encapsulation layer only needs to be enough to encapsulate the chip 201 to be packaged. By removing the sealing material on the back surface of the chip 201 to be packaged, the thickness of the subsequent first encapsulation layer can be reduced, so that the thickness of the packaged chip is reduced.

In actual operation, since the polymer insulating material is preferably liquid or pasty, after the spraying is completed, it will flow to surround the chip 201 to be packaged, cover the entire surface of the carrier 200 and fill the gap between the chip to be packaged and the chip to be packaged. After the material is cured by thermal curing, the sealing layer 203 can wrap up the chip 201 to be packaged to lock the position of the chip 201 to be packaged unchanged. The shape of the sealing layer 203 mainly depends on the properties such as viscosity, tension and the like of the material of the adhesive layer formed on the carrier 200. Of course, in other embodiments, the sealing layer 203 may also be formed by dispensing or the like. The sealing layer material is dispensed on the adhesive layer 203 between the chips to be packaged by air or mechanical pressure, so that the sealing layer material does not cover the back surface of the chip 201 to be packaged, as shown in FIG. 2(b3). The sealing layer shall be curable material, and cured by using high temperature, ultraviolet rays or the like. According to the above embodiment of the present disclosure, the sealing layer 203 is at least wrapped around the chip 201 to be packaged, so that it is possible to avoid the situation that after the chip 201 to be packaged is displaced in a subsequent process, the rewiring layer cannot be electrically connected to the bonding pad on the active surface of the chip 201 to be packaged due to the inability to predict the positions of the chip 201 to be packaged after the displacement.

Optionally, when the sealing layer 203 is formed, the sealing layer material covers the entire carrier 200, so that the sealing layer 203 is formed as a continuous piece, that is, the sealing layer 203 is continuously and uninterruptedly formed on the upper surface of the first encapsulation layer and at least wrapped around the chip to be packaged, to achieve the optimal effect of locking the chip. Of course, the sealing layer 203 can also cover the entire carrier 200 in sections. Each section of the sealing layer wraps up at least one chip to be packaged, and a portion of the surface of the adhesive layer 203 is exposed between each section of the sealing layer. Optionally, the thickness of the sealing layer 203 is smaller than the thickness of the chip such that the back surface of the chip is higher than the sealing layer 203, so that a locking structure is formed between the chip and the sealing layer. Meanwhile, as a whole, a concave-convex pattern is formed on the carrier 200. Thereby, when the encapsulation layer is formed subsequently, due to the existence of the concave-convex pattern, the connection between the encapsulation layer and the sealing layer is tighter and the encapsulation layer is not easily delaminated from the sealing layer and does not easily move relative to the sealing layer.

In step 103, a first encapsulation layer is formed, and the first encapsulation layer covers the entire carrier for encapsulating the at least one chip to be packaged and the sealing layer.

As shown in FIG. 2(*c*), the first encapsulation layer 204 is formed on the sealing layer 203 and the chip 201 to be packaged and is used to completely encapsulate the sealing layer 203 and the chip 201 to be packaged to reconstruct a flat plate structure, so that after the carrier 200 is detached, rewiring and packaging can be continued on the reconstructed flat plate structure.

Optionally, prior to forming the first encapsulation layer 204, some pretreatment steps, such as chemical cleaning and plasma cleaning, may be performed to remove impurities on the surface, so that the first encapsulation layer can be more closely connected to the chip to be packaged and the first carrier without delamination or cracking.

In one embodiment, the first encapsulation layer 204 may be formed by laminating an epoxy resin film or ABF (Ajinomoto buildup film), or may be formed by performing injection molding, compression molding or transfer molding with respect to an epoxy resin compound). The first encapsulation layer 204 includes a first surface 2041 opposite to the carrier and is substantially flat and parallel to the surface of the carrier 200. The thickness of the first encapsulation layer 204 may be thinned by grinding or polishing the first surface 2041. In one embodiment, the thickness of the first encapsulation layer 204 may be thinned to the back surface of the chip 201 to be packaged.

In the prior art, when the carrier is encapsulated with an encapsulation material without using a sealing layer, as the encapsulation layer needs to be cured during molding, the encapsulation material shrinks during curing, which may lead to the displacement of the chip, and thus the position of the chip cannot be predicted accurately and the wiring difficulty is increased during the subsequent rewiring. In addition, based on the principle of the above curing of the encapsulation layer material, a pressure is generated inside the encapsulation layer 204 against the carrier 200 (if the encapsulation layer material is thermally cured, the encapsulation layer 204 also shrinks after being cooled to increase the internal pressure). After the carrier is detached, since the encapsulation layer 204 is no longer limited by the carrier 200, the internal pressure of the encapsulation layer 204 is released, resulting that the entire package body after the carrier is detached to warp. The greater the degree of the warp, the greater the difficulty of rewiring.

On the other hand, in the embodiment of the present disclosure, since the chip is locked at the mounting position by the sealing layer, not only the risk of displacement of the chip can be reduced or eliminated, but also the sealing layer formed between the carrier and the encapsulation layer also serves as a transition between the two to ease the internal pressure caused by the difference in the coefficients of expansion of the carrier material and the encapsulation material, thereby reducing or eliminating the warpage of the entire package body after the carrier is detached. Therefore, the problem of warpage of the entire package body after the carrier is detached can be solved by controlling or/and adjusting the ratio of the thickness of the sealing layer to the thickness of the encapsulation layer, the properties of the sealing layer material (such as the coefficient of expansion and the modulus of elasticity) and the like.

In step 104, the carrier is detached to expose the active surface of the at least one chip to be packaged.

In one embodiment, as shown in FIG. 2(*d*), the carrier 200 can be directly mechanically detached from the sealing layer 203 and the chip 201 to be packaged. When the adhesive layer 202 between the carrier 200 and the chip 201 to be packaged is provided with a thermal separation material, the thermal separation material on the adhesive layer 202 may also be heated to reduce the viscosity, so as to detach the carrier 200. After the carrier 200 is detached, the lower surface of the sealing layer 203 and the active surface of the chip 201 to be packaged facing towards the carrier 200 are exposed. Of course, in some embodiments, if a routing layer (the routing layer is used for routing the bonding pad on the active surface of the chip to other position) and/or a protective layer (the protective layer is used for covering the bonding pad or the routing layer on the active surface of the chip 201) is formed on the active surface of the chip 201 to be packaged, the protective layer or the routing layer on the active surface of the chip 201 to be packaged is exposed. After the carrier 200 is detached, a flat plate structure including the at least one chip 201 to be packaged, the sealing layer 203 wrapped around the chip 201 to be packaged, and the first encapsulation layer 204 encapsulating the sealing layer 203 and the chip 201 to be packaged is obtained. The formed flat plate structure may be rewired or the like according to the actual situation.

In step 105, the packaging is completed by a rewiring process on the active surface of the at least one chip to be packaged.

In the present embodiment, after the packaging of the back surface of the chip 201 to be packaged is completed and the carrier 200 is detached to expose the active surface of the chip 201 to be packaged, specifically, rewiring and the like may be performed with respect to the active surface of the chip to be packaged according to the actual application.

In one embodiment, step 105 may include:

forming a passivation layer on the active surface of the at least one chip to be packaged and the sealing layer;

forming a first opening in the passivation layer at a position corresponding to a bonding pad of the at least one chip to be packaged;

forming a first rewiring layer such that the first rewiring layer is electrically connected to the bonding pad of the at least one chip to be packaged through the first opening; and forming a second encapsulation layer for encapsulating the first rewiring layer and the exposed passivation layer and leading out a bonding pad or a connection point of the first rewiring layer through a first electrically conductive stud.

In this embodiment, the active surface of the chip 201 to be packaged is provided with the bonding pads of the chip internal circuit, and these bonding pads can be led out by rewiring on the active surface of the chip 201 to be packaged. As shown in FIG. 2(*e*), during rewiring, a passivation layer 205 may be formed on the exposed sealing layer 203 and the active surface of the chip 201 to be packaged to protect the active surface of the chip 203 to be packaged and provide a flat surface for the subsequent processes. The passivation layer 205 may be formed of polyimide or polymer material by screen-printing, spray-coating, lamination or the like. Optionally, the material of the passivation layer 205 may be cured by high temperature or ultraviolet rays.

In one embodiment, the material of the passivation layer 205 may be the same as the material of the sealing layer 203.

In one embodiment, after the passivation layer 205 is formed, the first rewiring layer 206 is formed on the passivation layer 205. The first rewiring layer 206 is electrically connected to the bonding pad on the active surface of the chip 201 to be packaged through the first opening 2051 in the passivation layer 205. As shown in FIG. 2(f), the first opening 2051 may be formed in the passivation layer 205 in a manner of hole-opening after the passivation layer 205 is formed, such that the bonding pad on the active surface of the chip 201 to be packaged or the wiring led our from the bonding pad is exposed from the first opening 2051. If the material of the passivation layer is a laser reactive material, the hole-opening can be performed in a manner of forming one first opening 2051 at one time by laser patterning. If the material of the passivation layer is a photosensitive material, the hole-opening can be performed in a manner of forming a plurality of first openings 2051 at one time by photolithographic patterning.

In one embodiment, as shown in FIG. 2(g), the first rewiring layer 206 is formed on the surface of the passivation layer 205. The first rewiring layer 206 is formed of an electrically conductive material, for example, a metal such as copper, nickel, gold and the like. The first rewiring layer 206 includes a connecting portion filled in the first opening 2051 and a patterned routing formed on the surface of the passivation layer 205. The connecting portion is electrically connected to the bonding pad on the surface of the chip 201 to be packaged, and the patterned routing is electrically connected to the connecting portion.

In one embodiment, as shown in FIG. 2(h), after the first rewiring layer 206 is formed, it is packaged with a second encapsulation layer 207. After the packaging is completed, the patterned routing on the first rewiring layer 206 is exposed from the surface of the second encapsulation layer 207 through the first electrically conductive stud 208 (for example, a metal post or a protruding bonding pad).

In one embodiment, the step of forming the second encapsulation layer for encapsulating the first rewiring layer and the exposed passivation layer and leading out the connection point of the first rewiring layer through the first electrically conductive stud includes: forming the first electrically conductive stud on the connection point of the first rewiring layer; and forming the second encapsulation layer on the first rewiring layer and the exposed passivation layer and exposing the first electrically conductive stud. For example, as shown in FIG. 2(i), the first electrically conductive stud 208 is formed by photolithography and electroplating on the patterned routing of the first rewiring layer 206. And then, the second encapsulation layer 207 is formed so that the first electrically conductive stud 208 is embedded in the second opening 2071 of the second encapsulation layer 207.

In another embodiment, the step of forming the second encapsulation layer for encapsulating the first rewiring layer and the exposed passivation layer and leading out the connection point of the first rewiring layer through the first electrically conductive stud includes: forming the second encapsulation layer on the first rewiring layer and the exposed passivation layer; forming a second opening in the second encapsulation layer at a position corresponding to the bonding pad or the connection point of the first rewiring layer; and forming the first electrically conductive stud in the second opening. For example, as shown in FIG. 2 (j), the second encapsulation layer 207 may be formed on the first rewiring layer 206, then the second opening 2071 is formed in the second encapsulation layer 207 by hole-opening, and an electrically conductive material is filled in the second opening 2071 to form the first electrically conductive stud 208. In still another embodiment, the second opening 2071 may not be filled, so that the connection point of the first rewiring layer of the completed package body is exposed from the second opening 2071.

The shape of the first electrically conductive stud 208 is preferably a circular shape, and of course may be other shapes such as a rectangular shape, a square shape or the like. The electrically conductive stud 208 is electrically connected to the first rewiring layer.

In one embodiment, the second encapsulation layer 207 may be formed by lamination, molding or printing, and an epoxy compound is preferably used. The second encapsulation layer 207 covers the passivation layer 205 and the first rewiring layer 206. The first rewiring layer 206 is exposed from the surface of the second encapsulation layer 207 through the first electrically conductive stud 208. When the first electrically conductive stud 208 is first formed and the second encapsulation layer 207 is formed, the second encapsulation layer 207 covers all the exposed surfaces of the passivation layer 205 and the first rewiring layer 206, and then thinned to the surface of the first electrically conductive stud 208.

In one embodiment, in the case where a plurality of chips 201 to be packaged are packaged together, after the packaging of the first rewiring layer is completed, the whole package structure is cut into a plurality of package bodies only including a single chip by laser or mechanical cutting, as shown in FIG. 2(k).

In another embodiment, the step of completing the packaging by the rewiring process on the active surface of the at least one chip to be packaged includes:

forming a second rewiring layer on the encapsulated first rewiring layer, the second rewiring layer being electrically connected to the connection point of the first rewiring layer through the first electrically conductive stud; and forming a third encapsulation layer for encapsulating the second rewiring layer and the exposed second encapsulation layer and leading out a connection point of the second rewiring layer through a second electrically conductive stud.

In the present embodiment, as shown in FIG. 2(l), the second rewiring layer 209 is formed on the first rewiring layer 206. The first rewiring layer 206 and the second rewiring layer 209 are electrically connected through the first electrically conductive stud 208. The connection point on the second rewiring layer 209 is led out through the second electrically conductive stud 211 and the second rewiring layer 209 and the exposed second encapsulation layer 207 are covered by the third encapsulation layer 210. The second electrically conductive stud 211 leads out the connection point on the second rewiring layer 209 through the third opening in the third encapsulation layer 210. In this way, a multilayer package structure can be realized. The structure diagram of the formed multilayer package structure is shown in FIG. 2(l).

In one embodiment, the step of forming the third encapsulation layer for encapsulating the second rewiring layer and the exposed second encapsulation layer and leading out the connection point of the second rewiring layer through the second electrically conductive stud includes: forming the second electrically conductive stud on the connection point of the second rewiring layer; and forming the third encapsulation layer on the second rewiring layer and the exposed second encapsulation layer and exposing the second electrically conductive stud. In another embodiment, the step of forming the third encapsulation layer for encapsulating the second rewiring layer and the exposed second encapsulation layer and leading out the connection point of the second rewiring layer through the second electrically conductive stud includes: forming the third encapsulation layer on the second rewiring layer and the exposed second encapsulation layer; forming a third opening in the third encapsulation layer at a position corresponding to the connection point of the second rewiring layer; and forming the second electrically conductive stud in the third opening.

The forming manner of the second rewiring layer is similar to the forming manner of the first rewiring layer. The second electrically conductive stud may be formed on the second rewiring layer after the second rewiring layer is formed and then the third encapsulation layer is formed, and the second electrically conductive stud is exposed by a corresponding process so that the second electrically conductive stud can lead out the connection point on the second rewiring layer. The third encapsulation layer may also be formed on the second rewiring layer first and then the third opening is formed in the third encapsulation layer, and the second electrically conductive stud is formed in the third opening so that the second electrically conductive stud can be electrically connected to the connection point on the second rewiring layer. For the specific details, reference may be made to the description of the first rewiring layer described above, and details are not described herein again.

In one embodiment, the above-described method of packaging a chip further includes:

mounting at least one passive component on the carrier at a position in the vicinity of the at least one chip to be packaged prior to forming the sealing layer, a back surface of the passive component facing upwards, and an active surface facing towards the first carrier; and performing rewiring on the active surface of the at least one passive component while completing the packaging by the rewiring process on the active surface of the at least one chip to be packaged.

The passive component may be a capacitor, a resistor, an inductor or an integrated passive device. The passive component includes an active surface and a back surface, and a bonding pad is exposed on the active surface to form an electrical connection with an external circuit. The back surface of the passive component faces upwards away from the carrier, and the active surface faces towards the carrier.

Figure 4:
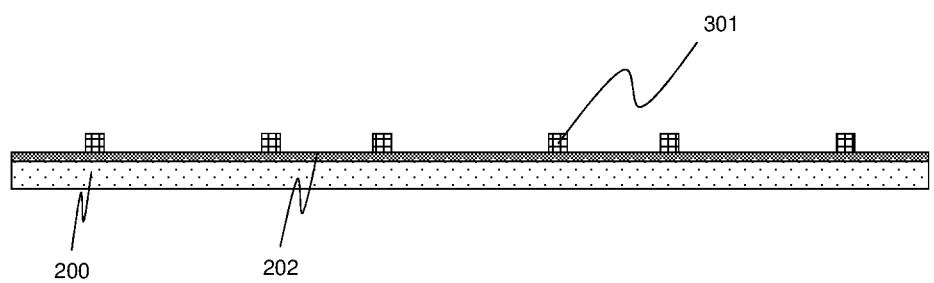
FIGS. 4(a) to 4(m) illustrate a method of packaging a chip with a passive component in an exemplary embodiment of the present disclosure.
Figure 4:
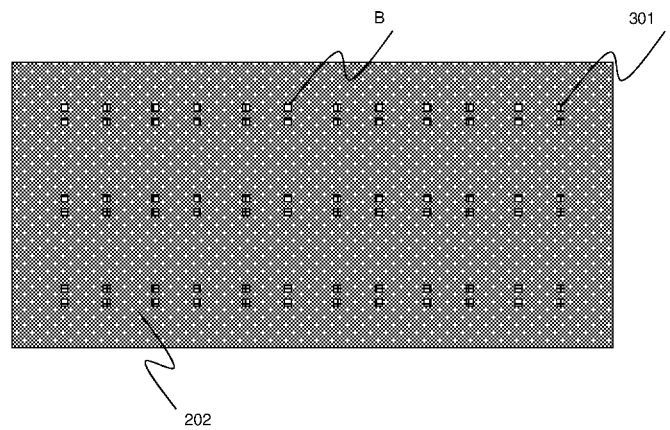
Figure 4:
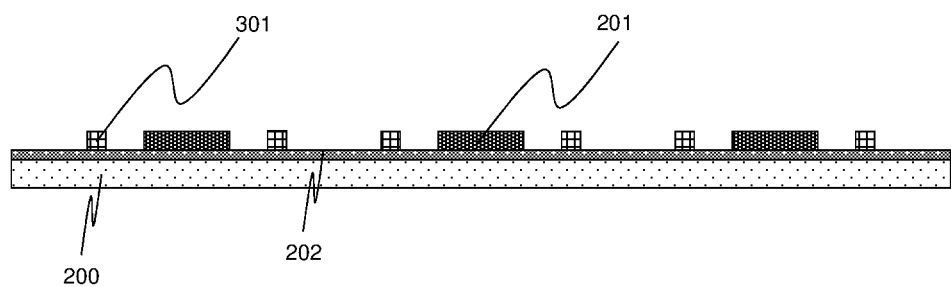
Figure 4:
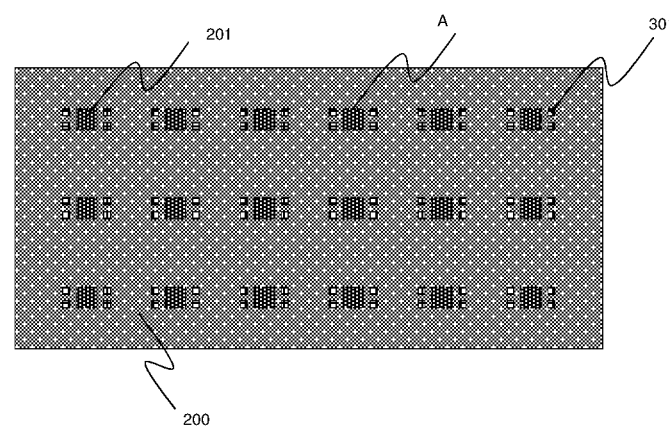
Figure 4:
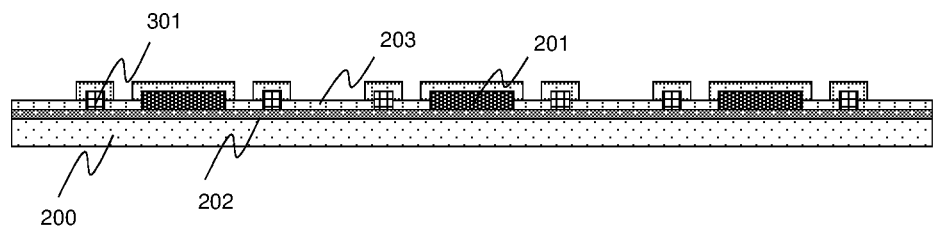
Figure 4:
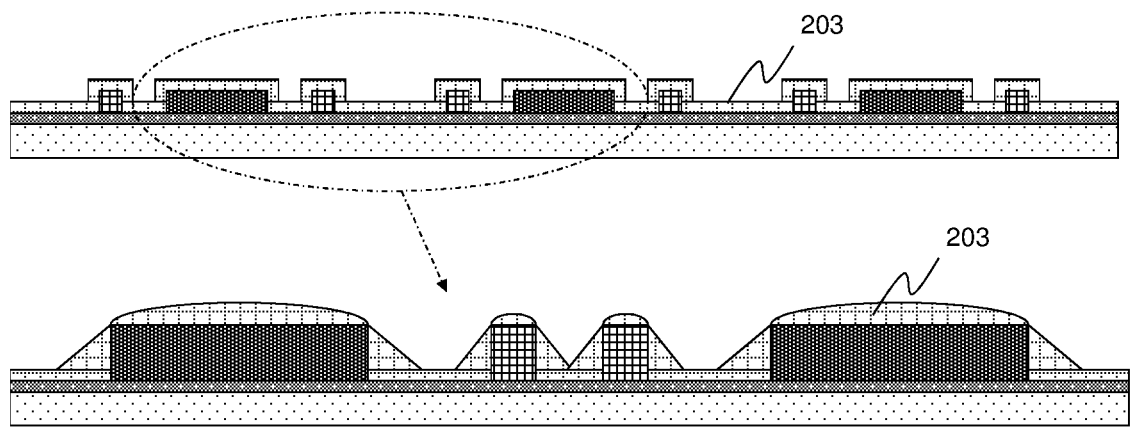
Figure 4:
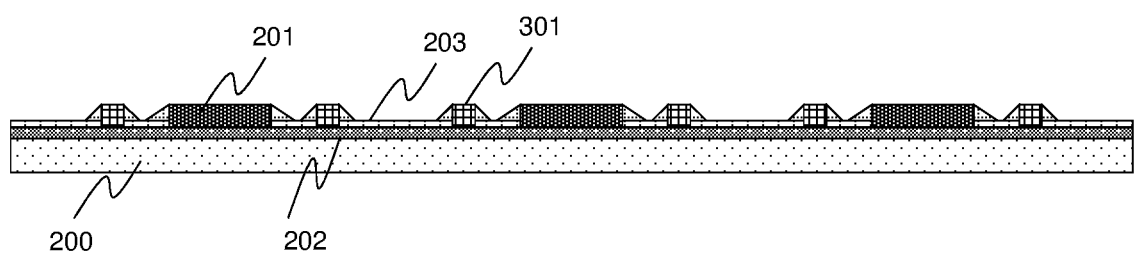
Figure 4:
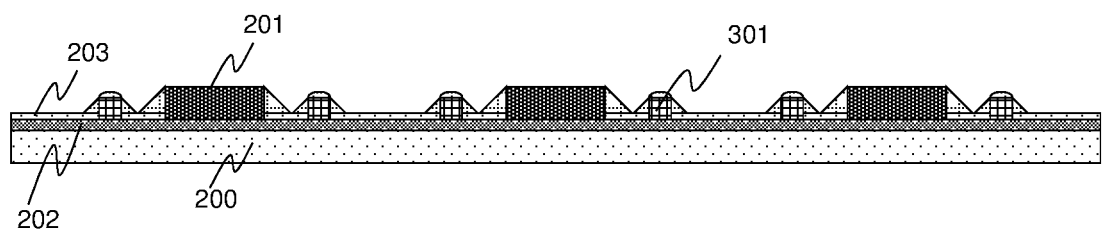
Figure 4:
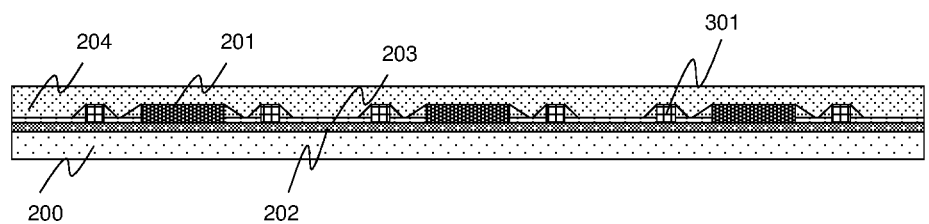
Figure 4:
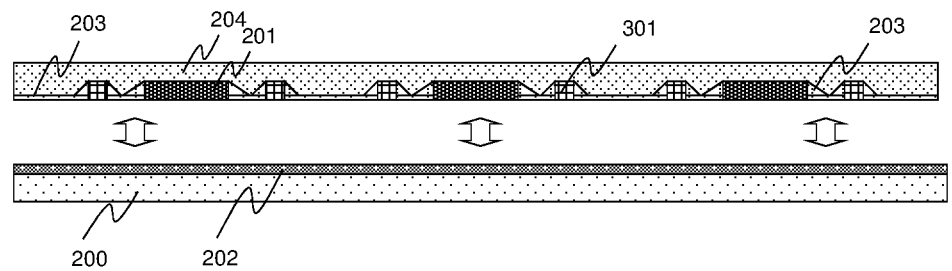
Figure 4:
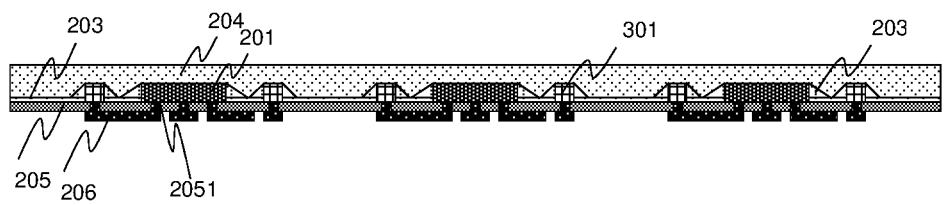
Figure 4:
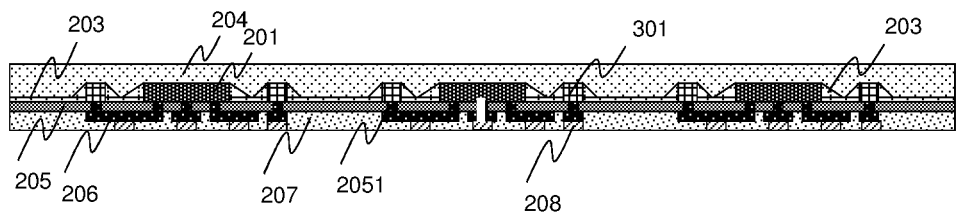
Figure 4:
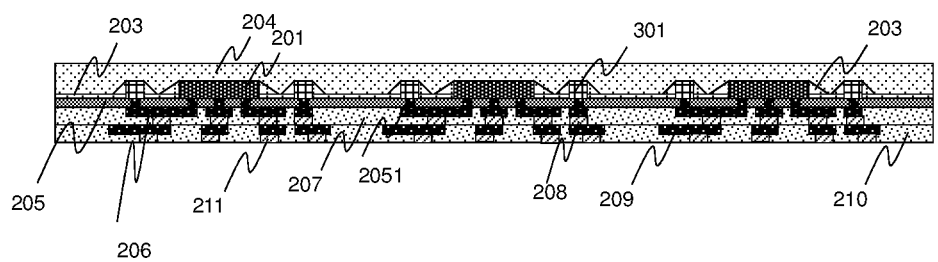

FIGS. 4(a) to (m) show the process flowcharts of a method of packaging a chip mounted with a passive component in an exemplary embodiment of the present disclosure. As shown in FIG. 4(a), after the adhesive layer 202 is formed on the carrier 200, a passive component 301 is mounted on the adhesive layer 202. The passive component 301 is mounted at a predetermined position B of the carrier 200 (see FIG. 4(b)), so that the passive component 301 is located in the vicinity of the chip 201 to be packaged. As shown in FIG. 4 (c), the passive component 301 is located on the left and the right sides of the chip 201 to be packaged, and one chip 201 to be packaged corresponds to four passive components 301. It can be understood that the amount and the arrangement manner of the passive component 301 can be determined as needed, and are not limited to the embodiment shown in FIG. 4(b). Further, the passive component 301 may also be mounted after the chip 201 to be packaged is mounted on the carrier 200, which is specifically determined according to actual situation.

As shown in FIG. 4(d), the chip 201 to be packaged is mounted at a predetermined position A (see 4(d)). The front surface of the carrier mounted with the chip 201 to be packaged is as shown in FIG. 4(d), and two passive components 301 are respectively mounted on the left and right side of a component 201 to be packaged. FIG. 4(d) is only a schematic arrangement, and there may also be other arrangements according to the actual situation.

As shown in FIG. 4(e), a sealing layer 203 is formed on the carrier mounted with the chip 201 to be packaged and the passive component 301. The sealing layer 203 is at least formed around the chip 201 to be packaged and the passive component 301 and covers the exposed adhesive layer 202. In other embodiments, the sealing layer 203 may also cover the back surfaces of the chip 201 to be packaged and the passive component 301, and the sealing layer 203 covering the back surfaces of the chip 201 to be packaged and the passive component 301 may be removed according to the actual situation.

The sealing layer 203 may be formed by spraying, printing, coating or the like using a liquid or pasty polymer insulating material. After the spraying is completed, the sealing layer 203 flows to surround the chip 201 to be packaged and the passive component 301, covers the surface of the adhesive layer 202, and fills the gap between the component to be packaged and the components to be packaged, the gap between the passive component and the passive component, and the gap between the component to be packaged and the passive component. And the sealing layer 203 is cured by thermal curing to wrap the chip 201 to be packaged and the passive component 301 so as to lock the positions of chip 201 to be packaged and the passive component 301 unchanged. The shape of the sealing layer 203 mainly depends on the properties such as viscosity, tension and the like of the adhesive layer material formed on the carrier 200, as shown in FIG. 4(f). In other embodiments, the sealing layer 203 may also be formed by dispensing or the like. The sealing layer material is dispensed on the adhesive layer 203 between the chips to be packaged by air or mechanical pressure, so that the sealing layer material does not cover the back surface of the chip 201 to be packaged, as shown in FIG. 4(h). According to the above embodiment of the present disclosure, the sealing layer 203 is at least wrapped around the chip 201 to be packaged and the passive component 301, so that it is possible to avoid the situation that the chip 201 to be packaged and the passive component 301 are displaced in a subsequent process, resulting in the rewiring layer being unable to be electrically connected to the bonding pad on the active surface of the chip 201 to be packaged and the bonding pad on the active surface of the passive component 301.

The size of a passive component is usually smaller than the size of a chip, and the size of the smallest passive component can be 0.2*0.4 mm or 0.1*0.05 inch. When the contact area between the passive component and the adhesive layer is too small, the adhesive force is small. Therefore, when the encapsulation layer is formed by laminating or molding, the encapsulation material needs to be formed on the carrier by pressure, and when this pressure is applied to the relatively small passive component, the passive component may be displaced or even fall off from the adhesive layer. Or in the formation of the encapsulation material, since the encapsulation material needs to be cured, the relatively small passive component may also be displaced or even fall off from the adhesive layer due to the tension generated by shrinking of the encapsulation material during the curing. However, in the embodiment of the present disclosure, the sealing layer is used to cover completely or cover around the passive component. Since the sealing layer is formed by spraying, printing, coating, dispensing or the like without pressure (or under low pressure), it does not have any influence on the passive component (and the packaged chip), and thus displacement or falling off will not occur in the formation of the sealing layer. When the encapsulation layer is subsequently formed (after the sealing layer material is cured), due to the locking effect of the sealing layer, the passive component (and the packaged chip) is less prone to be displaced or fall off.

In one embodiment, the above-described method of packaging a chip further includes:

removing the sealing layer on the back surface of the at least one passive component and the back surface of the at least one chip to be packaged prior to forming the first encapsulation layer when the thickness of the at least one passive component is identical to the thickness of the at least one chip to be packaged;

removing the sealing layer on the back surface of the at least one chip to be packaged prior to forming the first encapsulation layer when the thickness of the at least one passive component is smaller than the thickness of the at least one chip to be packaged; and removing the sealing layer on the back surface of the at least one passive component prior to forming the first encapsulation layer when the thickness of the at least one passive component is greater than the thickness of the at least one chip to be packaged.

FIG. 4(f) only shows the case where the thickness of the passive component 301 is identical to the thickness of the chip 201 to be packaged. In fact, the thickness of the passive component 301 may be greater or smaller than the thickness of the chip 201 to be packaged. In the case where the thickness of the passive component 301 is greater than the thickness of the chip 201 to be packaged, it is possible to remove only the sealing layer on the back surface of the passive component 301, as shown in FIG. 4(g). And in the case where the thickness of the chip 201 to be packaged is greater than the thickness of the passive component 301, it is possible to remove only the sealing layer on the back surface of the chip 201 to be packaged, as shown in FIG. 4(h). In this way, it can be ensured that the passive component 301 and the chip 201 to be packaged are surrounded and encapsulated by the sealing layer 203, and the thickness of the chip package structure can also be reduced as a whole.

After the sealing layer 203 is formed, a first encapsulation layer 204 is formed on the sealing layer 203. As shown in FIG. 4(i), the first encapsulation layer 204 is formed on the sealing layer 203, and the sealing layer 203 covers the passive component 301, the chip 201 and the exposed adhesive layer surface. The thickness of the first encapsulation layer 204 is greater than the thickness of the passive component 301 and the thickness of the chip 201. FIG. 4(i) only shows the case where the thickness of the passive component 301 is identical to the thickness of the chip 201 to be packaged, and the sealing layer 203 is formed at least around the passive component 301 and the chip 201 to be packaged. The subsequent steps will be described according to this embodiment. After the first encapsulation layer 204 is formed and cured, the carrier 200 is detached, as shown in FIG. 4(j). For the detaching process of the carrier 200, reference may be made to the above first embodiment, and details are not described herein again.

After the detaching, the active surfaces of the chip 201 to be packaged and the passive component 301 are packaged. For the specific packaging process, reference may be made to the first embodiment. As shown in FIG. 4(k), the active surfaces of the passive component and the chip 201 to be packaged are rewired to form a passivation layer 205 and a first rewiring layer 206, the first rewiring layer 206 being electrically connected to the chip 201 to be packaged and the passive component 301 through the first opening 2051 formed in the passivation layer 205. The details are not described herein again. FIG. 4(k) only shows the case where there is a connection point between the back surface of the passive component 301 and the first rewiring layer 206. However, it can be understood that there may be two or more connection points between the passive component 301 and the first rewiring layer 206.

Then, as shown in FIG. 4(l), a second encapsulation layer 207 is formed on the first rewiring layer 206 to encapsulate the first rewiring layer 206 and the exposed passivation layer 205. A bonding pad or connection point on the first rewiring layer 206 is led out to the surface of the second encapsulation layer 207 through a first electrically conductive stud 208. The passive component 301 is electrically connected to the chip 201 to be packaged through the first rewiring layer 206.

For the multilayer wiring structure, a second rewiring layer 209 may be further disposed on the second encapsulation layer 207, and then the second rewiring layer 209 is packaged by a third encapsulation layer 210, a bonding pad or a connection point on the second rewiring layer 209 being led out from the surface of the third encapsulation layer 210 through a second electrically conductive stud 211, as shown in FIG. 4(m). The details are similar to the above packaging embodiment only including the chip to be packaged, which is not described herein again.

Figure 5:
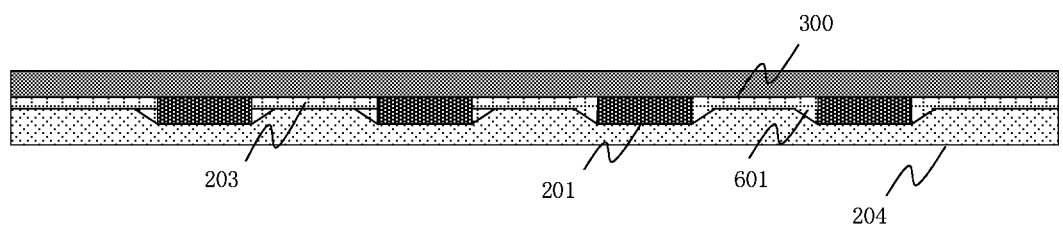
FIG. 5 is a schematic structural diagram of a chip package structure obtained according to a method of packaging a chip in an exemplary embodiment of the present disclosure.

FIG. 5 is a schematic structural diagram of a chip package structure (combination, panel level or wafer level) obtained according to the method of packaging the chip provided by an exemplary embodiment of the present disclosure. As shown in FIG. 5, the chip package structure includes:

a first encapsulation layer 204 disposed with at least one concave first cavity 601;

at least one chip 201 to be packaged located in the at least one first cavity 601, the back surface of the chip 201 to be packaged facing towards the first encapsulation layer 204;

a sealing layer 203 formed on the upper surface of the first encapsulation layer 204 and at least wrapped around the chip 201 to be packaged; and a rewiring structure 300 formed on the active surface of the chip 201 to be packaged for leading out the bonding pad on the active surface of the chip 201 to be package.

Optionally, the package unit structure includes only one said first cavity 601 and one chip 201 to be packaged respectively. And the package combination includes a plurality of the first cavities 601 and a plurality of chips 201 to be packaged, and each chip 201 to be packaged is correspondingly located in one first cavity 601.

In this embodiment, the structure of the sealing layer shown in FIG. 5 is only exemplary, and it may also be the structure as shown in FIG. 2(b1) or 2(b2). The chip package structure described above can be obtained by the above method of packing the chip and the process flow shown in FIGS. 2(a) to (l). For the specific details, reference may be made to above detailed description of the method of packaging the chip and the process flow, and details are not described herein again.

Figure 6:
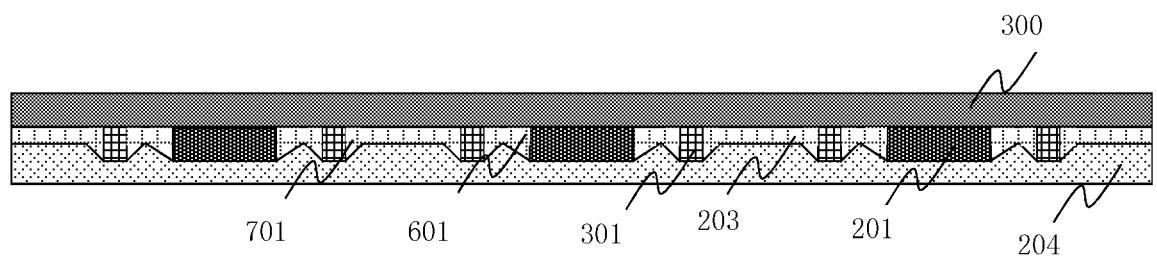
FIG. 6 is a schematic structural diagram of a chip package structure obtained according to a method of packaging a chip in another exemplary embodiment of the present disclosure.

FIG. 6 is a schematic structural diagram of a chip package structure (assembly, panel level or wafer level) obtained according to the method of packaging the chip provided by another exemplary embodiment of the present disclosure. As shown in FIG. 6, the chip package structure includes:

a first encapsulation layer 204 disposed with at least one concave first cavity 601;

at least one chip 201 to be packaged located in the first cavity 601, the back surface of the chip 201 to be packaged facing towards the first encapsulation layer 204;

at least one passive component 301 located in at least one concave second cavity 701 disposed on the first encapsulation layer 204, wherein the second cavity is disposed in the vicinity of the first cavity and the back surface of the passive component 301 faces towards the first encapsulation layer 204;

a sealing layer 203 formed on the upper surface of the first encapsulation layer 204 and at least wrapped around the chip 201 to be packaged and the passive component 301; and a rewiring structure 300 formed on the active surface of the chip 201 to be packaged for leading out the bonding pad on the active surface of the chip 201 to be package.

In one embodiment, one of the back surface of the chip 201 to be packaged and the back surface of the passive component 301 is in direct contact with the first encapsulation layer 204, and the other one and the first encapsulation layer 204 are provided with the sealing layer 203 therebetween; or both the back surface of the chip 201 to be packaged and the back surface of the passive component 301 are in direct contact with first encapsulation layer 204.

Optionally, the package unit structure includes only one said first cavity 601 and one chip 201 to be packaged respectively, and may include one or more passive components 301 and one or more second cavities 701, wherein the specific amount depends on the actual requirements of the package structure, and each passive component 301 is correspondingly located in one second cavity 701. The package combination includes a plurality of the first cavities 601 and a plurality of chips 201 to be packaged, and each chip 201 to be packaged is correspondingly located in one first cavity 601. A plurality of passive components 301 and a plurality of second cavities 701 may also be included, wherein the specific amount depends on the actual requirements of the package structure, and each passive component 301 is correspondingly located in one second cavity 701.

The structure of the sealing layer shown in FIG. 6 is only exemplary, and it may also be the structure as shown in FIG. 4(f). The chip package structure including the passive component in the above embodiment can be manufactured by the process flow shown in FIGS. 4(a) to (m). For the specific details, reference may be made to the above description of FIGS. 4(a) to (m), and details are not described herein again.

Figure 7:
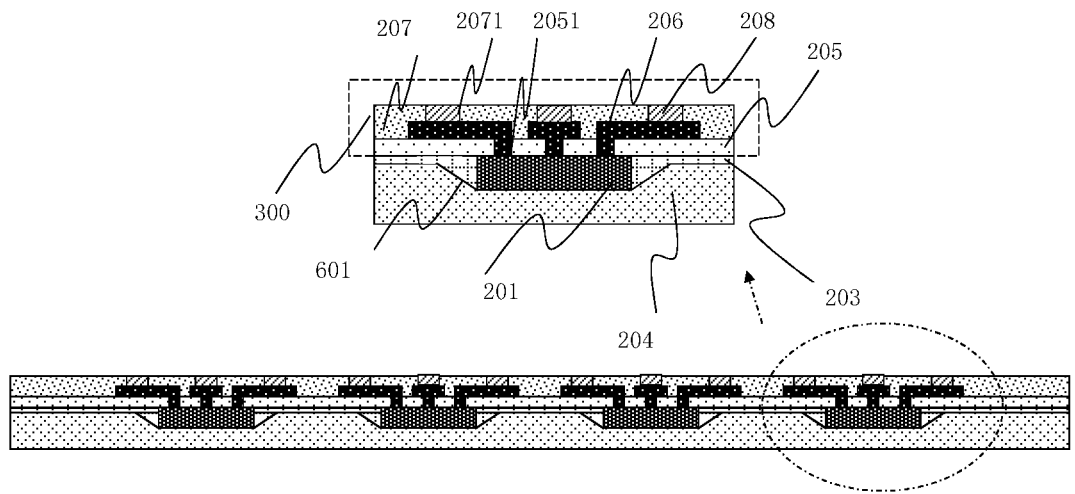
FIG. 7 is a schematic structural diagram of a chip package structure obtained according to a method of packaging a chip in yet another exemplary embodiment of the present disclosure.

FIG. 7 is a schematic structural diagram of a chip package structure (unit and combination) in an exemplary embodiment of the present disclosure. As shown in FIG. 7, the chip package structure includes:

a first encapsulation layer 204 disposed with at least one concave first cavity 601;

at least one chip 201 to be packaged located in the first cavity 601, the back surface of the chip 201 to be packaged facing towards the first encapsulation layer 204;

a sealing layer 203 formed on the upper surface of the first encapsulation layer 204 and at least wrapped around the chip 201 to be packaged; and a rewiring structure 300 including:

a passivation layer 205 formed on the sealing layer 203 and the active surface of the chip 201 to be packaged and provided with a first opening 2051 at a position corresponding to a position of the bonding pad on the chip 201 to be packaged;

a first rewiring layer 206 formed on the passivation layer 205 and electrically connected to the bonding pad of the chip 201 to be packaged through the first opening 2051; and a second encapsulation layer 207 formed on the first rewiring layer 206 and the exposed passivation layer 205 and having a second opening 2071, wherein a first electrically conductive stud 208 electrically connected to the first rewiring layer 206 is disposed in the second opening 2071.

Optionally, the package unit structure includes only one said first cavity 601 and one chip 201 to be packaged respectively. And the package combination includes a plurality of the first cavities 601 and a plurality of chips 201 to be packaged, and each chip 201 to be packaged is correspondingly located in one first cavity 601.

In the present embodiment, the chip package structure described above can be obtained by the above method of packing the chip and the process flow shown in FIGS. 2(a) to (l). For the specific details, reference may be made to above detailed description of the method of packaging the chip and the process flow, and details are not described herein again.

Figure 8:
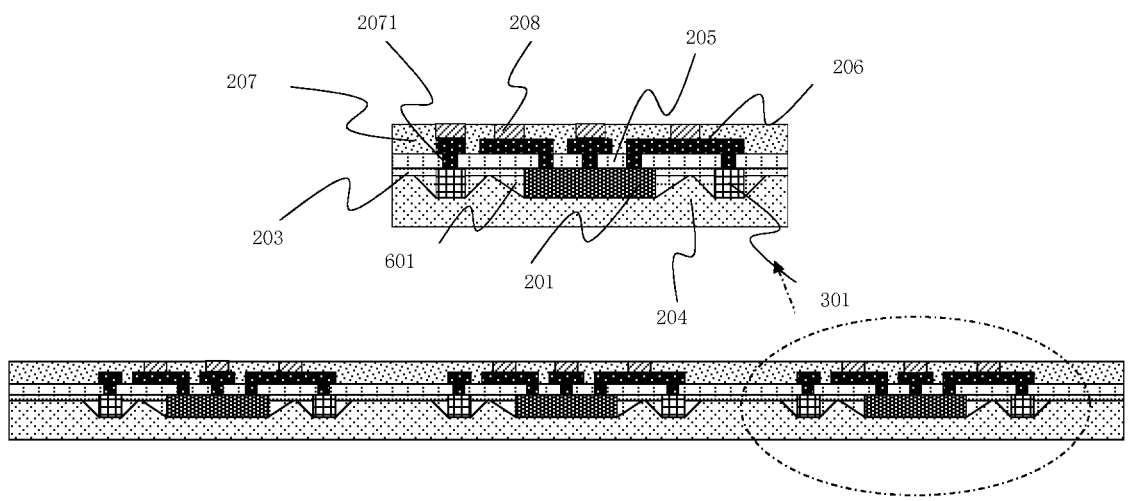
FIG. 8 is a schematic structural diagram of a chip package structure obtained according to a method of packaging a chip in yet another exemplary embodiment of the present disclosure.

FIG. 8 is a schematic structural diagram of a chip package structure (unit and combination) in another exemplary embodiment of the present disclosure. As shown in FIG. 8, the chip package structure includes:

a first encapsulation layer 204 disposed with at least one concave first cavity 601;

at least one chip 201 to be packaged located in the first cavity 601, the back surface of the chip 201 to be packaged facing towards the first encapsulation layer 204;

at least one passive component 301 located in at least one concave second cavity 701 disposed on the first encapsulation layer 204, wherein the second cavity 701 is disposed in the vicinity of the first cavity and the back surface of the passive component 301 faces towards the first encapsulation layer 204;

a sealing layer 203 formed on the upper surface of the first encapsulation layer 204 and at least wrapped around the chip 201 to be packaged and the passive component 301; and a rewiring structure 300 including:

a passivation layer 205 formed on the sealing layer 203 and the active surface of the chip 201 to be packaged and provided with a first opening 2051 at a position corresponding to a position of the bonding pad on the chip 201 to be packaged;

a first rewiring layer 206 formed on the passivation layer 205 and electrically connected to the bonding pad of the chip 201 to be packaged through the first opening 2051; and a second encapsulation layer 207 formed on the first rewiring layer 206 and the exposed passivation layer 205 and having a second opening 2071, wherein a first electrically conductive stud 208 electrically connected to the first rewiring layer 206 is disposed in the second opening 2071.

Optionally, the package unit structure includes only one said first cavity 601 and one chip 201 to be packaged respectively, and may include one or more passive components 301 and one or more second cavities 701, wherein the specific amount depends on the actual requirements of the package structure, and each passive component 301 is correspondingly located in one second cavity 701. The package combination includes a plurality of the first cavities 601 and a plurality of chips 201 to be packaged, and each chip 201 to be packaged is correspondingly located in one first cavity 601. A plurality of passive components 301 and a plurality of second cavities 701 may also be included, wherein the specific amount depends on the actual requirements of the package structure, and each passive component 301 is correspondingly located in one second cavity 701.

The chip package structure including the passive component in the above embodiment can be manufactured by the process flow shown in FIGS. 4(a) to (l). For the specific details, reference may be made to the above description of FIGS. 4(a) to (l), and details are not described herein again.

Figure 9:
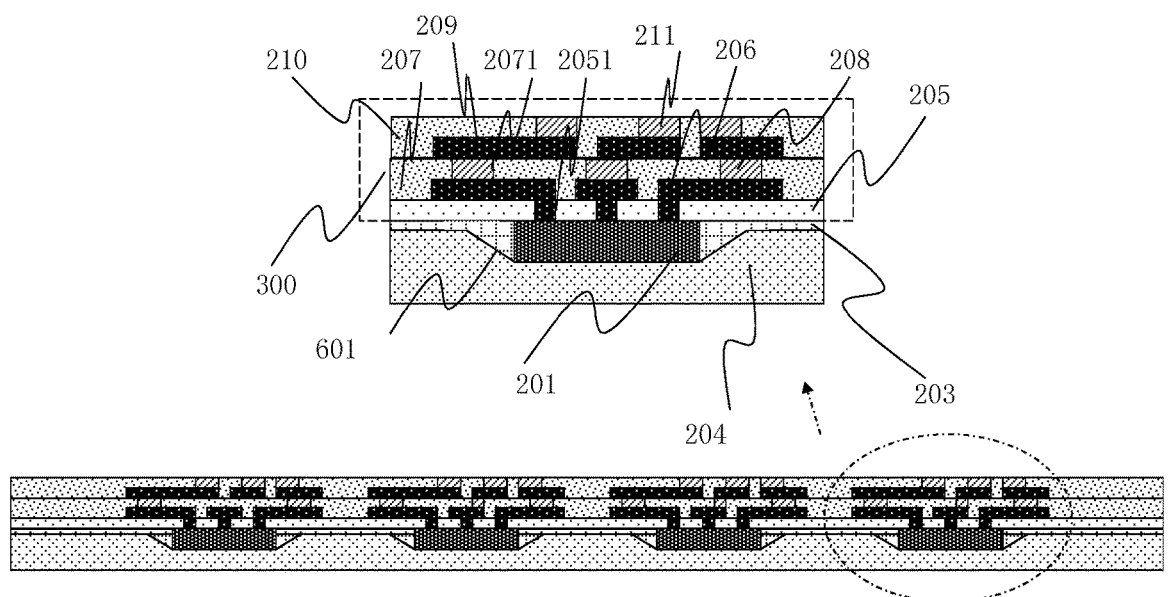
FIG. 9 is a schematic structural diagram of a chip package structure obtained according to a method of packaging a chip in yet another exemplary embodiment of the present disclosure.

FIG. 9 is a schematic structural diagram of a chip package structure (unit and combination) in another exemplary embodiment of the present disclosure. As shown in FIG. 9, the chip package structure includes:

a first encapsulation layer 204 disposed with at least one concave first cavity 601;

at least one chip 201 to be packaged located in the first cavity 601, the back surface of the chip 201 to be packaged facing towards the first encapsulation layer 204;

a sealing layer 203 formed on the upper surface of the first encapsulation layer 204 and at least wrapped around the chip 201 to be packaged; and a rewiring structure 300 including:

a passivation layer 205 formed on the sealing layer 203 and the active surface of the chip 201 to be packaged and provided with a first opening 2051 at a position corresponding to a position of the bonding pad on the chip 201 to be packaged;

a first rewiring layer 206 formed on the passivation layer 205 and electrically connected to the bonding pad of the chip 201 to be packaged through the first opening 2051; and a second encapsulation layer 207 formed on the first rewiring layer 206 and the exposed passivation layer 205 and having a second opening 2071, wherein a first electrically conductive stud 208 electrically connected to the first rewiring layer 206 is disposed in the second opening 2071.

a second rewiring layer 209 formed on the second encapsulation layer 207 and electrically connected to the bonding pad or connection point of the first rewiring layer 206 through the first electrically conductive stud 208; and a third encapsulation layer 210 for encapsulating the second rewiring layer 209 and the exposed second encapsulation layer 207 and leading out the bonding pad or the connection point of the second rewiring layer 209 through the second electrically conductive stud 211.

Optionally, the package unit structure includes only one said first cavity 601 and one chip 201 to be packaged respectively. And the package combination includes a plurality of the first cavities 601 and a plurality of chips 201 to be packaged, and each chip 201 to be packaged is correspondingly located in one first cavity 601.

For the details of the present embodiment, reference may be made to the description of the above method of packaging the chip and the process flow shown in FIGS. 2(a) to (l), details are not described herein again.

Figure 10:
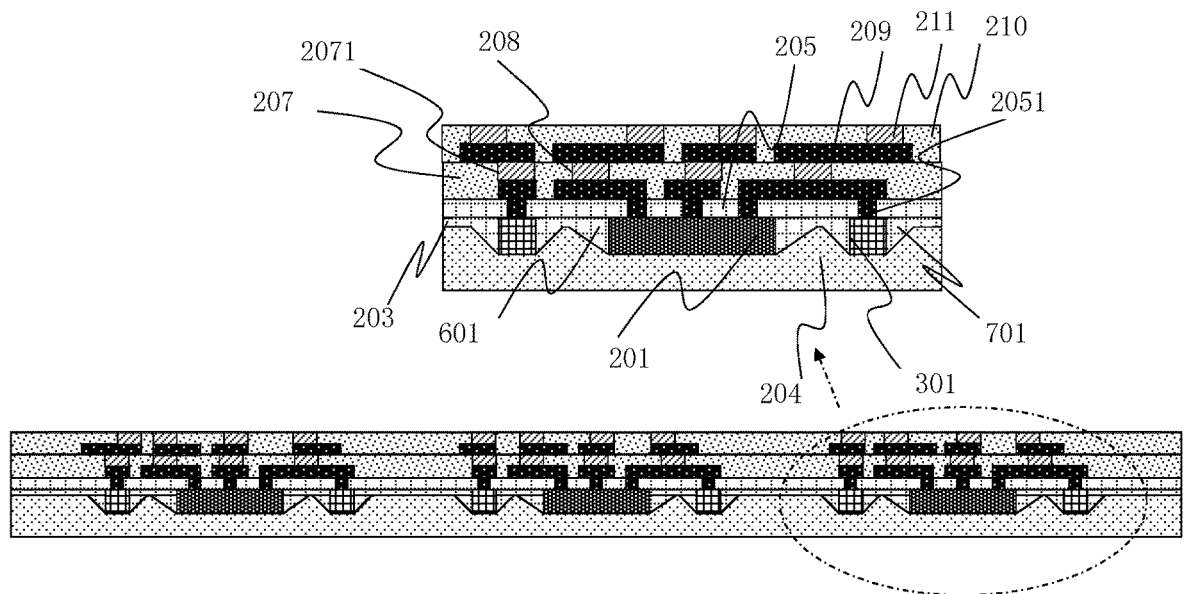
FIG. 10 is a schematic structural diagram of a chip package structure obtained according to a method of packaging a chip in yet another exemplary embodiment of the present disclosure.

FIG. 10 is a schematic structural diagram of a chip package structure (unit and combination) in another exemplary embodiment of the present disclosure. As shown in FIG. 10, the chip package structure includes:

a first encapsulation layer 204 disposed with at least one concave first cavity 601;

at least one chip 201 to be packaged located in the first cavity 601, the back surface of the chip 201 to be packaged facing towards the first encapsulation layer 204;

at least one passive component 301 located in at least one concave second cavity 701 disposed on the first encapsulation layer 204, wherein the second cavity is disposed in the vicinity of the first cavity and the back surface of the passive component 301 faces towards the first encapsulation layer 204;

a sealing layer 203 formed on the upper surface of the first encapsulation layer 204 and at least wrapped around the chip 201 to be packaged and the passive component 301; and a rewiring structure 300 including:

a passivation layer 205 formed on the sealing layer 203 and the active surface of the chip 201 to be packaged and provided with a first opening 2051 at a position corresponding to a position of the bonding pad on the chip 201 to be packaged;

a first rewiring layer 206 formed on the passivation layer 205 and electrically connected to the bonding pad of the chip 201 to be packaged through the first opening 2051;

a second encapsulation layer 207 formed on the first rewiring layer 206 and the exposed passivation layer 205 and having a second opening 2071, wherein a first electrically conductive stud 208 electrically connected to the first rewiring layer 206 is disposed in the second opening 2071.

a second rewiring layer 209 formed on the second encapsulation layer 207 and electrically connected to the bonding pad or connection point of the first rewiring layer 206 through the first electrically conductive stud 208; and a third encapsulation layer 210 for encapsulating the second rewiring layer 209 and the exposed second encapsulation layer 207 and leading out the bonding pad or the connection point of the second rewiring layer 209 through the second electrically conductive stud 211.

Optionally, the package unit structure includes only one said first cavity 601 and one chip 201 to be packaged respectively, and may include one or more passive components 301 and one or more second cavities 701, wherein the specific amount depends on the actual requirements of the package structure, and each passive component 301 is correspondingly located in one second cavity 701. The package combination includes a plurality of the first cavities 601 and a plurality of chips 201 to be packaged, and each chip 201 to be packaged is correspondingly located in one first cavity 601. A plurality of passive components 301 and a plurality of second cavities 701 may also be included, wherein the specific amount depends on the actual requirements of the package structure, and each passive component 301 is correspondingly located in one second cavity 701.

The chip package structure including the passive component in the above embodiment can be manufactured by the process flow shown in FIGS. 4(a) to (m). For the specific details, reference may be made to the above description of FIGS. 4(a) to (m), and details are not described herein again.

The above specific embodiments are used to describe the objectives, technical solutions and beneficial effects of the present disclosure in further detail. It should be understood that the foregoing is only the specific embodiments of the present disclosure and is not intended to limit the present disclosure. Any modifications, equivalent replacements, improvements, and the like made within the spirit and principle of the present disclosure should be included in the scope of the present disclosure.

What is claimed is:

1. A method of packaging a chip, comprising:

mounting at least one chip to be packaged on a carrier, a back surface of the chip to be packaged facing upwards and an active surface facing towards the carrier;

forming a sealing layer, the sealing layer being at least wrapped around the at least one chip to be packaged, wherein the sealing layer forms locking fillets along sidewalls of the at least one chip to be packaged, the locking fillets encircling the at least one chip to be packaged;

forming a first encapsulation layer, wherein the first encapsulation layer covers the entire carrier for encapsulating the at least one chip to be packaged and the sealing layer;

detaching the carrier from the at least one chip to be packaged; and completing the packaging by a rewiring process on the active surface of the at least one chip to be packaged.

2. The method according to claim 1, wherein the step of mounting the at least one chip to be packaged on the carrier comprises:

forming an adhesive layer on the carrier; and mounting the at least one chip to be packaged on the carrier at a predetermined position by the adhesive layer.

3. The method according to claim 2, wherein the step of forming the sealing layer comprises:

covering a sealing material on the back surface of the at least one chip to be packaged and an exposed surface of the adhesive layer by using a semiconductor process;

removing the sealing material on the back surface of the at least one chip to be packaged; and curing the sealing material.

4. The method according to claim 1, wherein a height of the sealing layer is lower than a height of the at least one chip to be packaged, and the sealing layer is a thermosetting insulating material or an ultraviolet curing insulating material.

5. The method according to claim 1, wherein the step of completing the packaging by the rewiring process on the active surface of the at least one chip to be packaged comprises:

forming a passivation layer on the active surface of the at least one chip to be packaged and the sealing layer;

forming a first opening in the passivation layer at a position corresponding to a bonding pad of the at least one chip to be packaged;

forming a first rewiring layer such that the first rewiring layer is electrically connected to the bonding pad of the at least one chip to be packaged through the first opening; and forming a second encapsulation layer for encapsulating the first rewiring layer and the exposed passivation layer and leading out a bonding pad or a connection point of the first rewiring layer through a first electrically conductive stud.

6. The method according to claim 5, wherein the step of completing the packaging by the rewiring process on the active surface of the at least one chip to be packaged further comprises:

forming a second rewiring layer on the second encapsulation layer, the second rewiring layer being electrically connected to the bonding pad or the connection point of the first rewiring layer through the first electrically conductive stud; and forming a third encapsulation layer for encapsulating the second rewiring layer and the exposed second encapsulation layer and leading out a bonding pad or a connection point of the second rewiring layer through a second electrically conductive stud.

7. The method according to claim 5, wherein the step of forming the second encapsulation layer for encapsulating the first rewiring layer and the exposed passivation layer and leading out the bonding pad or the connection point of the first rewiring layer through the first electrically conductive stud comprises:

forming the first electrically conductive stud on the bonding pad or the connection point of the first rewiring layer; and forming the second encapsulation layer on the first rewiring layer and the exposed passivation layer and exposing the first electrically conductive stud; or the step of forming the second encapsulation layer for encapsulating the first rewiring layer and the exposed passivation layer and leading out the bonding pad or the connection point of the first rewiring layer through the first electrically conductive stud comprises:

forming the second encapsulation layer on the first rewiring layer and the exposed passivation layer;

forming a second opening in the second encapsulation layer at a position corresponding to the bonding pad or the connection point of the first rewiring layer; and forming the first electrically conductive stud in the second opening.

8. The method according claim 6, wherein the step of forming the third encapsulation layer for encapsulating the second rewiring layer and the exposed second encapsulation layer and leading out the bonding pad or the connection point of the second rewiring layer through the second electrically conductive stud comprises:

forming the second electrically conductive stud on the bonding pad or the connection point of the second rewiring layer; and forming the third encapsulation layer on the second rewiring layer and the exposed second encapsulation layer and exposing the second electrically conductive stud; or the step of forming the third encapsulation layer for encapsulating the second rewiring layer and the exposed second encapsulation layer and leading out the bonding pad or the connection point of the second rewiring layer through the second electrically conductive stud comprises:

forming the third encapsulation layer on the second rewiring layer and the exposed second encapsulation layer;

forming a third opening on the third encapsulation layer at a position corresponding to the bonding pad or the connection point of the second rewiring layer; and forming the second electrically conductive stud in the third opening.

9. The method according to claim 1, further comprising:

mounting at least one passive component on the carrier at a position in the vicinity of the at least one chip to be packaged prior to forming the sealing layer, a back surface of the passive component facing upwards, and an active surface facing towards the first carrier; and performing rewiring on the active surface of the at least one passive component while completing the packaging by the rewiring process on the active surface of the at least one chip to be packaged.

10. The method according to claim 9, wherein when forming the sealing layer, the sealing layer is also wrapped around the at least one passive component so as to fix a position of the at least one passive component unchanged.

11. The method according to claim 10, further comprising at least one of:

removing the sealing layer on the back surface of the at least one passive component and the back surface of the at least one chip to be packaged prior to forming the first encapsulation layer when a thickness of the at least one passive component is identical to a thickness of the at least one chip to be packaged;

removing the sealing layer on the back surface of the at least one chip to be packaged prior to forming the first encapsulation layer when the thickness of the at least one passive component is smaller than the thickness of the at least one chip to be packaged; and removing the sealing layer on the back surface of the at least one passive component prior to forming the first encapsulation layer when the thickness of the at least one passive component is greater than the thickness of the at least one chip to be packaged.

12. A chip package structure, comprising:
a first encapsulation layer disposed with at least one concave first cavity;
at least one chip to be packaged located in the first cavity, a back surface of the at least one chip to be packaged facing towards the first encapsulation layer;
a sealing layer formed on an upper surface of the first encapsulation layer and at least wrapped around the at least one chip to be packaged, wherein the sealing layer forms locking fillets along sidewalls of the at least one chip to be packaged, the locking fillets encircling the at least one chip to be packaged; and
a rewiring structure formed on an active surface of the at least one chip to be packaged for leading out a bonding pad on the active surface of the at least one chip to be packaged.

13. The chip package structure according to claim 12, wherein the rewiring structure comprises:
a passivation layer formed on the sealing layer and the active surface of the at least one chip to be packaged and provided with a first opening at a position corresponding to a position of the bonding pad on the at least one chip to be packaged;
a first rewiring layer formed on the passivation layer and electrically connected to the bonding pad of the at least one chip to be packaged through the first opening; and
a second encapsulation layer formed on the first rewiring layer and having a second opening, wherein a first electrically conductive stud electrically connected to the first rewiring layer is disposed in the second opening.

14. The chip package structure according to claim 12, further comprising:
at least one passive component located in at least one concave second cavity disposed on the first encapsulation layer, wherein the second cavity is disposed in the vicinity of the first cavity, a back surface of the at least one passive component faces towards the first encapsulation layer, and the sealing layer is further wrapped around the at least one passive component.

15. The chip package structure according to claim 14, wherein one of the back surface of the at least one chip to be packaged and the back surface of the at least one passive component is in direct contact with the first encapsulation layer, and the other one and the first encapsulation layer are provided with the sealing layer therebetween; or both the back surface of the at least one chip to be packaged and the back surface of the at least one passive component are in direct contact with the first encapsulation layer.

16. The chip package structure according to claim 12, wherein the at least one passive component is a connecting component array comprising a plurality of electrically conductive studs, and the connecting component array is integrally packaged by an insulating material.

17. The chip package structure according to claim 12, further comprising:
a second rewiring layer formed on the second encapsulation layer and electrically connected to a bonding pad or a connection point of the first rewiring layer through the first electrically conductive stud; and
a third encapsulation layer for encapsulating the second rewiring layer and the exposed second encapsulation layer and leading out a bonding pad or a connection point of the second rewiring layer through a second electrically conductive stud.

18. The chip package structure according to claim 12, wherein a plurality of the chips to be packaged and a plurality of the first cavities are comprised, and each of the chips to be packaged is respectively located in one of the first cavities.

19. The chip package structure according to claim 18, wherein the sealing layer is continuously and uninterruptedly formed on the upper surface of the first encapsulation layer and is at least wrapped around the chip to be packaged.

* * * * *